(12) United States Patent
Uehara et al.

(10) Patent No.: US 7,135,755 B2
(45) Date of Patent: Nov. 14, 2006

(54) INTEGRATED SEMICONDUCTOR DEVICE PROVIDING FOR PREVENTING THE ACTION OF PARASITIC TRANSISTORS

(75) Inventors: Daiji Uehara, Niiza (JP); Hiroaki Nakamura, Niiza (JP)

(73) Assignee: Sanken Electric Co., Ltd. (JP)

( * ) Notice: Subject to any disclaimer, the term of this patent is extended or adjusted under 35 U.S.C. 154(b) by 223 days.

(21) Appl. No.: 10/948,936

(22) Filed: Sep. 24, 2004

(65) Prior Publication Data
US 2005/0067660 A1    Mar. 31, 2005

(30) Foreign Application Priority Data
Sep. 26, 2003    (JP)    ............................. 2003-334680

(51) Int. Cl.
*H01L 29/00*    (2006.01)

(52) U.S. Cl. ...................... 257/539; 257/509; 257/542; 257/544

(58) Field of Classification Search ................ 257/539, 257/509, 544, 542, 552, 565, 197, 273, 517, 257/93, 374, 446, 501, 523, 526
See application file for complete search history.

(56) References Cited

FOREIGN PATENT DOCUMENTS
JP        63-018660        1/1988

*Primary Examiner*—Douglas W. Owens
(74) *Attorney, Agent, or Firm*—Woodcock Washburn LLP

(57) ABSTRACT

An electric motor drive system is disclosed which includes a required number of motor driver circuits connected one to each motor armature coil. Fabricated in the form of an integrated circuit, each such motor driver circuit has a parasitic transistor unavoidably created between two neighboring transistors. The parasitic transistor would become conductive when the driver circuit output had a negative potential, adversely affecting the driver circuit operation. An additional transistor is provided in one embodiment of the invention in order to inhibit such action of the parasitic transistor. Becoming conductive when the driver circuit output goes negative, the additional transistor prevents conduction through the parasitic transistor. Another parasitic transistor is intentionally created in another embodiment for the same purpose.

9 Claims, 6 Drawing Sheets

INTEGRATED SEMICONDUCTOR DEVICE PROVIDING FOR PREVENTING THE ACTION OF PARASITIC TRANSISTORS

CROSS REFERENCE TO RELATED APPLICATIONS

This application claims priority to Japanese Application No. 2003-334680, filed Sep. 26, 2003.

BACKGROUND OF THE INVENTION

This invention relates to semiconductor devices in general and, in particular, to those especially well adapted for use in the electronic driver circuits of electric motors, among other applications. More particularly, the invention pertains to an integrated semiconductor device incorporating transistors or like active elements, featuring provisions for inhibiting or restricting the action of parasitic transistors under certain foreseeable conditions in use of the semiconductor device in motor drive systems or the like.

Japanese Unexamined Patent Publication No. 63-18660 is hereby cited as teaching a motor drive system (FIG. 1) representing a typical application of the instant invention. The motor drive system has a required number of motor driver circuits of like construction coupled one to each of the motor coils in star connection. Each motor driver circuit has four transistors in addition to two diodes. When the motor driver circuits were fabricated in the form of an integrated semiconductor circuit (FIG. 2), a parasitic transistor was unavoidably created between two neighboring ones of the transistors of each motor driver circuit. The parasitic transistor conducted when the output of the driver circuit had a negative potential, preventing the motor drive system from driving the motor exactly as required.

In order to prevent the appearance of the parasitic transistor, the cited Japanese patent application suggests the creation of a floating region between the two transistors in question which are formed island-like in the semiconductor substrate and which are separated therefrom via pn junctions. The floating region was intended to accomplish its purpose by making the space between the transistors higher in resistance. An objection to this prior art device is its inordinate space requirement between the transistors, adding substantively to the size of the semiconductor device.

SUMMARY OF THE INVENTION

The present invention has it as a primary object to prevent the undesired action of parasitic transistors in integrated semiconductor devices of the kind under consideration.

A more specific object of the invention is to provide integrated semiconductor devices of the kind under consideration which can be made significantly less in size than the noted prior art device having a floating region, in order to attain the first recited object to the same extent.

Briefly, the present invention concerns an integrated semiconductor device having a common semiconductor region of a first conductivity type formed in a semiconductor substrate. Formed in the common semiconductor region are a first and a second semiconductor element such as transistors. The first semiconductor element has a first island-like semiconductor region of a second conductivity type, opposite to the first conductivity type, which is contiguous to the common semiconductor region. The second semiconductor element has a second island-like semiconductor region of the second conductivity type contiguous to the common semiconductor region. The first and the second semiconductor element are spaced from each other via the common semiconductor region, with the consequent creation of a parasitic transistor by the common semiconductor region of the first conductivity type and the first and the second island-like semiconductor region of the second conductivity type. The invention provides performance-enhancer means connected to the second island-like semiconductor region and the common semiconductor region for preventing the conduction of the parasitic transistor when the second island-like semiconductor region is less in potential than the common semiconductor region.

In one embodiment of the invention the performance-enhancer means comprises a performance-enhancer transistor having an emitter connected to the second island-like semiconductor region, a collector connected to a separation subregion of the common semiconductor region between the first and the second island-like region, and a base grounded. In another embodiment a third island-like semiconductor region of the second conductivity type is formed in the semiconductor substrate in the adjacency of the second island-like semiconductor region. Another parasitic transistor is therefore intentionally created between the second and the third island-like region for counteracting the undesired parasitic transistor between the first and the second island-like region.

Either way, when the second island-like region grows less in potential than the common semiconductor region, so does the common semiconductor subregion between the first and the second island-like region. The parasitic transistor is thus prevented from acting to interfere with the desired functioning of the semiconductor device.

The above and other objects, features and advantages of this invention will become more apparent, and the invention itself will best be understood, from a study of the following description and appended claims, with reference had to the attached drawings showing the preferred embodiments of the invention.

DETAILED DESCRIPTION

Figure 1:
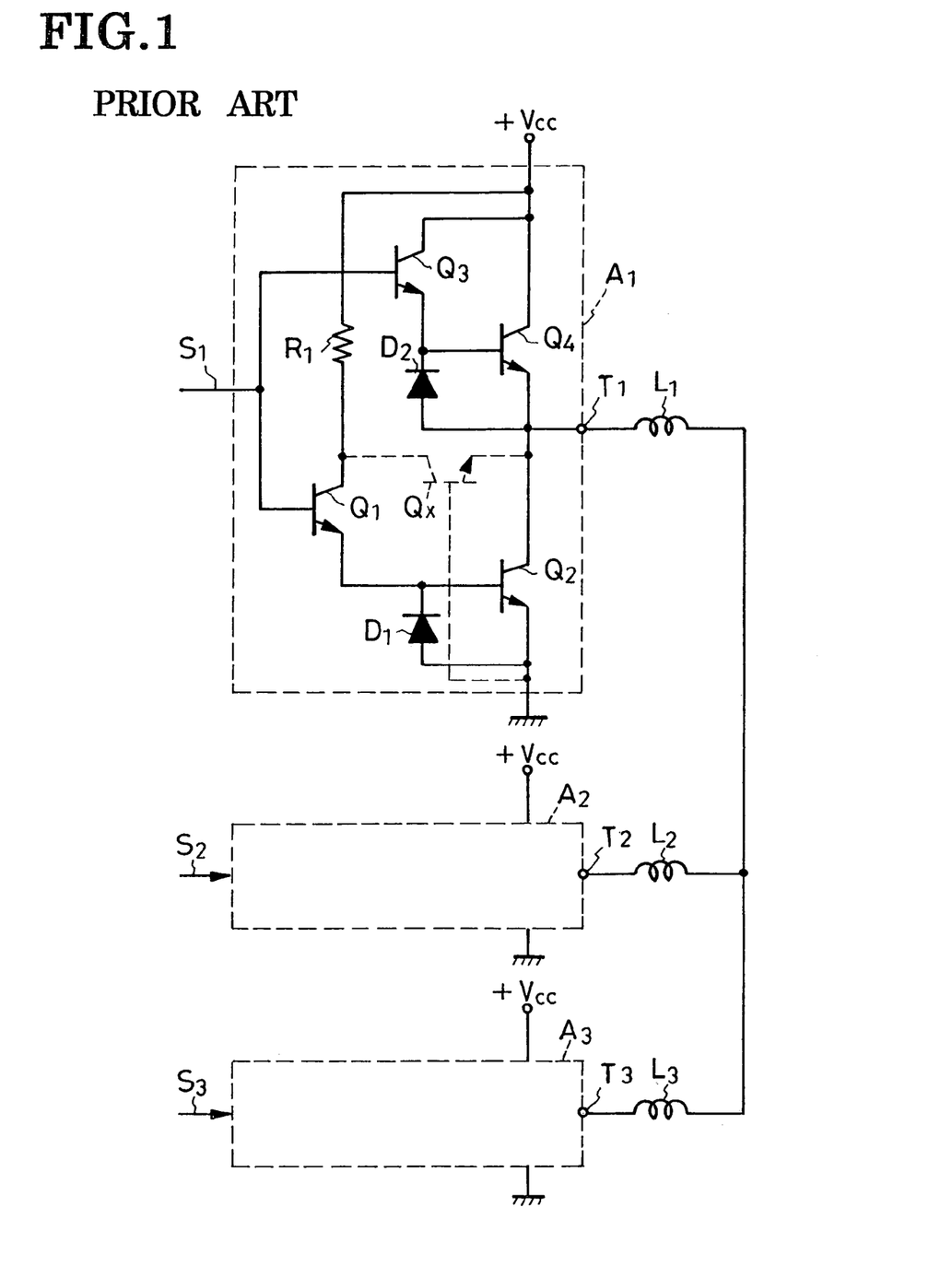
FIG. 1 is a schematic electrical diagram of a known motor drive system including motor driver circuits to each of which the present invention finds typical application, the diagram being explanatory of a parasitic transistor appearing in each motor driver circuit when the latter is fabricated in the form of an integrated circuit.

It is considered essential that the difficulties heretofore encountered in the part be shown and described in some more detail, the better to make clear the features and advantages of the instant invention. The prior art motor drive system of FIG. 1 is shown to have three driver circuits $A_1$, $A_2$ and $A_3$ for controlled energization of respective coils $L_1$, $L_2$ and $L_3$ which in fact form inductive loads. Only the first motor driver circuit $A_1$ is shown in detail in FIG. 1, it being understood that the other two are of identical make.

The representative first driver circuit $A_1$ comprises four npn transistors $Q_1$, $Q_2$, $Q_3$ and $Q_4$, two diodes $D_1$ and $D_2$, and a resistor $R_1$. The first transistor $Q_1$ at the driver stage has its base connected to the control signal input $S_1$ of the first driver circuit $A_1$, its collector to a dc supply terminal $+V_{cc}$ via the resistor $R_1$, and its emitter to the base of the second transistor $Q_2$ at the output stage. This second transistor $Q_2$ has its emitter grounded, and its collector to the output $T_1$ of the first driver circuit $A_1$. The third transistor $Q_3$, also at the driver stage, has its base connected to the control signal input $S_1$, its collector to the supply terminal $+V_{cc}$, and its emitter to the base of the fourth transistor $Q_4$ at the output stage. The fourth transistor $Q_4$ has its collector connected to the supply terminal $+V_{cc}$, and its emitter to the first driver circuit output $T_1$. The diodes $D_1$ and $D_2$ are connected reversely in parallel with the base-emitter junction of the second and fourth transistors $Q_2$ and $Q_4$, respectively.

The second and third motor driver circuits $A_2$ and $A_3$ have their own control signal inputs $S_2$ and $S_3$, and their own dc supply terminals $+V_{cc}$, connected thereto. The outputs $T_1$, $T_2$ and $T_3$ of the three motor driver circuits $A_1$–$A_3$ are connected respectively to the motor coils $L_1$–$L_3$ which on the other hand are interconnected to form a star network.

The three motor coils $L_1$–$L_3$ are selectively energized by the switching actions of the transistors $Q_2$ and $Q_4$ of the first driver circuit $A_1$ as well as the unshown equivalent transistors of the second and third driver circuits $A_2$ and $A_3$. (The unshown transistors of the second and third driver circuits $A_2$ and $A_3$ will be hereinafter identified by the same reference characters as those of the corresponding transistors $Q_1$–$Q_4$ of the first driver circuit $A_1$.) For instance, when the fourth transistor $Q_4$ of the first driver circuit $A_1$ and the second transistor $Q_2$ of the third driver circuit $A_3$ are both conductive, current will flow along the path comprising the supply terminal $+V_{cc}$, fourth transistor $Q_4$ and output $T_1$ of the first driver circuit $A_1$, the first motor coil $L_1$, the third motor coil $L_3$, and the second transistor $Q_2$ of the third driver circuit $A_3$.

If now the fourth transistor $Q_4$ is turned off, an electromotive force will develop inversely across the first motor coil $L_1$, with the result that the first driver circuit output $T_1$ has a negative potential. Assuming further that the first and second transistors $Q_1$ and $Q_2$ are now both nonconductive, the collector of the first transistor $Q_1$ will have approximately the same potential as does the supply terminal $+V_{cc}$ with the consequent development of a potential difference between the collector of the first transistor $Q_1$ and the output $T_1$. As indicated by the broken lines in FIG. 1, a parasitic npn transistor $Q_x$ may then be created between the collectors of the first and second transistors $Q_1$ and $Q_2$ if the first driver circuit $A_1$ is in the form of an integrated semiconductor circuit. This parasitic transistor will conduct when the driver circuit output $T_1$ is at negative potential, causing the motor to be driven in other than the desired way.

Figure 2:
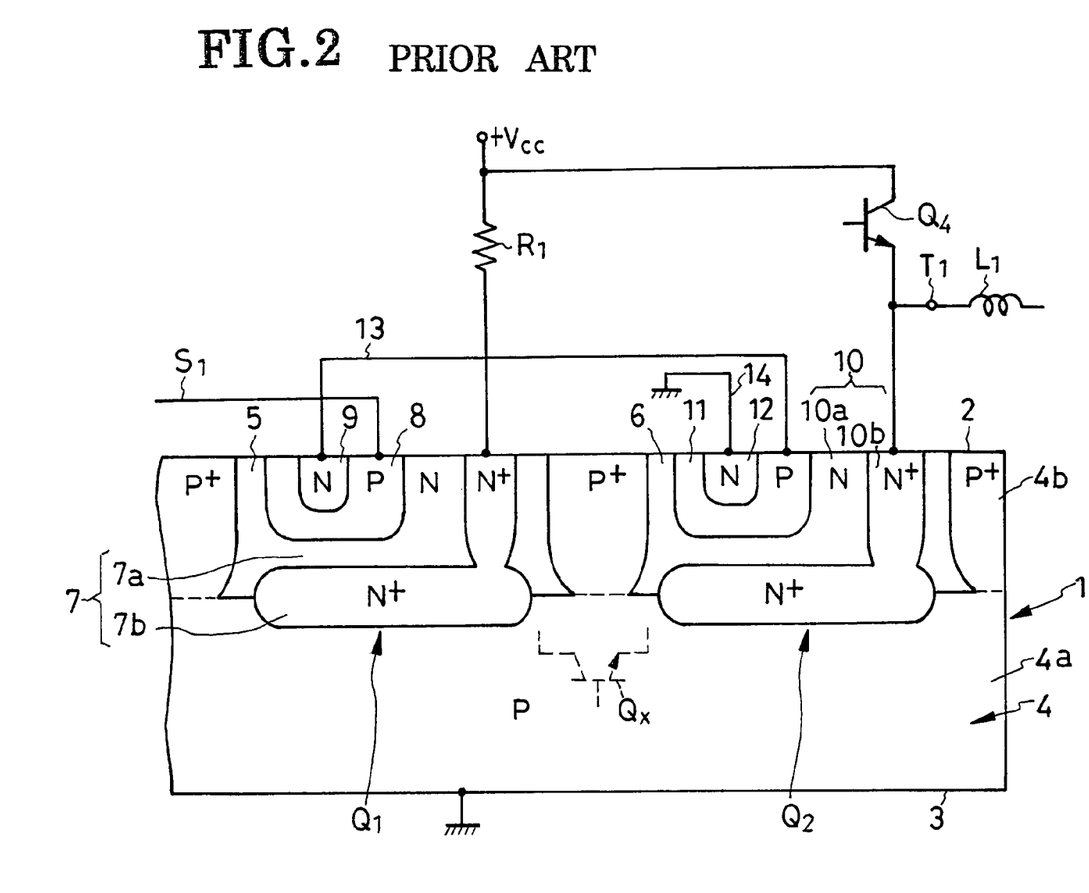
FIG. 2 is a fragmentary section through a known integrated semiconductor circuit incorporating one of the motor driver circuits of FIG. 1, the section revealing those two transistors of the motor driver circuit between which is created the parasitic transistor.

Why the parasitic transistor $Q_x$ appears between the collectors of the transistors $Q_1$ and $Q_2$ will become better understood by referring to FIG. 2. Shown here is a section through that part of an integrated semiconductor device where there are formed the transistors $Q_1$ and $Q_2$ of the FIG. 1 motor driver circuit $A_1$ in the immediate vicinity of each other. The generally flat semiconductor substrate 1 has a common (or grounded) semiconductor region 4 of a first conductivity type (shown as p) which is exposed at both of the pair of opposite major surfaces 2 and 3 of the substrate. Two semiconductor regions 5 and 6 of a second conductivity type (shown as n) are formed island-like in the common semiconductor region 4 so as to be exposed at the first major surface 2. These n-type island-like semiconductor regions 5 and 6 are isolated from the p-type semiconductor region 4 by pn junctions. These and other semiconductor regions are conventionally created in the substrate 1 by epitaxial growth and impurity diffusion.

The term "common semiconductor region 4" used above comprehends both the inherently p-type substrate subregion $4_a$, which is exposed at the substrate major surface 3, and the $p^+$-type separation subregion $4_b$ which lies on the side of the other substrate major surface 2. The complete common semiconductor region 4 could be called a separation or isolation region.

The first island-like region 5 has formed therein an n-type collector region 7, a p-type base region 8, and an n-type emitter region 9, for providing the first transistor $Q_1$. The collector region 7 comprises an n-type collector subregion $7_a$ of relatively high resistance and an $n^+$-type collector subregion $7_b$ of relatively low resistance. The collector subregion $7_a$ is constituted of either part or whole of the first island-like region 5.

The second island-like region 6 has likewise formed therein an n-type collector region 10, a p-type base region 11, and an n-type emitter region 9, for providing the second transistor $Q_2$. The collector region 10 comprises an n-type collector subregion $10_a$ of relatively high resistance and an $n^+$-type collector subregion $10_b$ of relatively low resistance. The collector subregion $10_a$ is constituted of either part or whole of the second island-like region 6.

It is understood that the integrated semiconductor device of FIG. 2 has also formed therein the transistors $Q_3$ and $Q_4$, diodes $D_1$ and $D_2$, etc., of the FIG. 1 motor driver circuit $A_1$ in addition to the first and second transistors $Q_1$ and $Q_2$. The third transistor $Q_3$ is not shown in FIG. 2, however, because it is unessential for the explanation of the parasitic transistor $Q_x$ for which this figure is intended. The fourth transistor $Q_4$ is depicted as a schematic electronic symbol on the outside of the semiconductor substrate 1 for illustrative convenience.

FIG. 2 further indicates diagrammatically that the first transistor $Q_1$ has its p-type base region 8 connected to the control signal input $S_1$, its n-type emitter region 9 to the p-type base region 11 of the second transistor $Q_2$ by way of a conductor 13, and its low-resistance collector subregion $7_b$ to its supply terminal $+V_{cc}$ via the noted resistor $R_1$. The second transistor $Q_2$ has its n-type emitter region 12 grounded by way of a conductor 14, and its low-resistance collector subregion $10_b$ connected to the driver output $T_1$ and thence to the motor coil $L_1$. The p-type common semiconductor region 4 is grounded.

A closer study of FIG. 2 will reveal the parasitic transistor $Q_x$ which, as indicated by the broken lines, may appear between the transistors $Q_1$ and $Q_2$. The parasitic transistor $Q_x$ is of npn configuration, manifesting itself as the p-type common semiconductor region 4 is interposed in part between the n-type first island-like region 5, which forms the collector of the first transistor $Q_1$, and the n-type second island-like region 6 which forms the collector of the second transistor $Q_2$. This parasitic transistor $Q_x$ is nonconductive when the driver output $T_1$ and second island-like region 6 have both a positive potential with respect to that of the common semiconductor region 4, because then the parasitic transistor has its base-emitter junction reverse-biased. When the driver output $T_1$ and second island-like region 6 have a negative potential, on the other hand, the parasitic transistor $Q_x$ has its base-emitter junction forward-biased and so is conductive.

An obvious solution to the problem of how to inhibit the appearance, or restrict the action, of the parasitic transistor might seem to place the two island-like regions 5 and 6 sufficiently far away from each other for these purposes. This solution is unsatisfactory because it would add very much to the size of the semiconductor substrate 1. As has been stated, Japanese Unexamined Patent Publication No. 63-18660, supra, suggests a somewhat more practical solution: The creation of an n-type floating region in that part of the p-type common semiconductor region 4 which lies between the island-like regions 5 and 6. The floating region is designed to make the spacing between the island-like regions 5 and 6 higher in resistance. Admittedly, this known remedy makes less space requirement between the island-like regions 5 and 6 than does the first suggested solution; nevertheless, an inconveniently large space is still required in order for the floating region to perform its intended function to the full.

The present invention succeeds in eliminating practically any undesired activity of parasitic transistors in integrated semiconductor devices of the kind in question without these inconveniences of the prior art. What follows is the description of some preferred embodiments.

Figure 3:
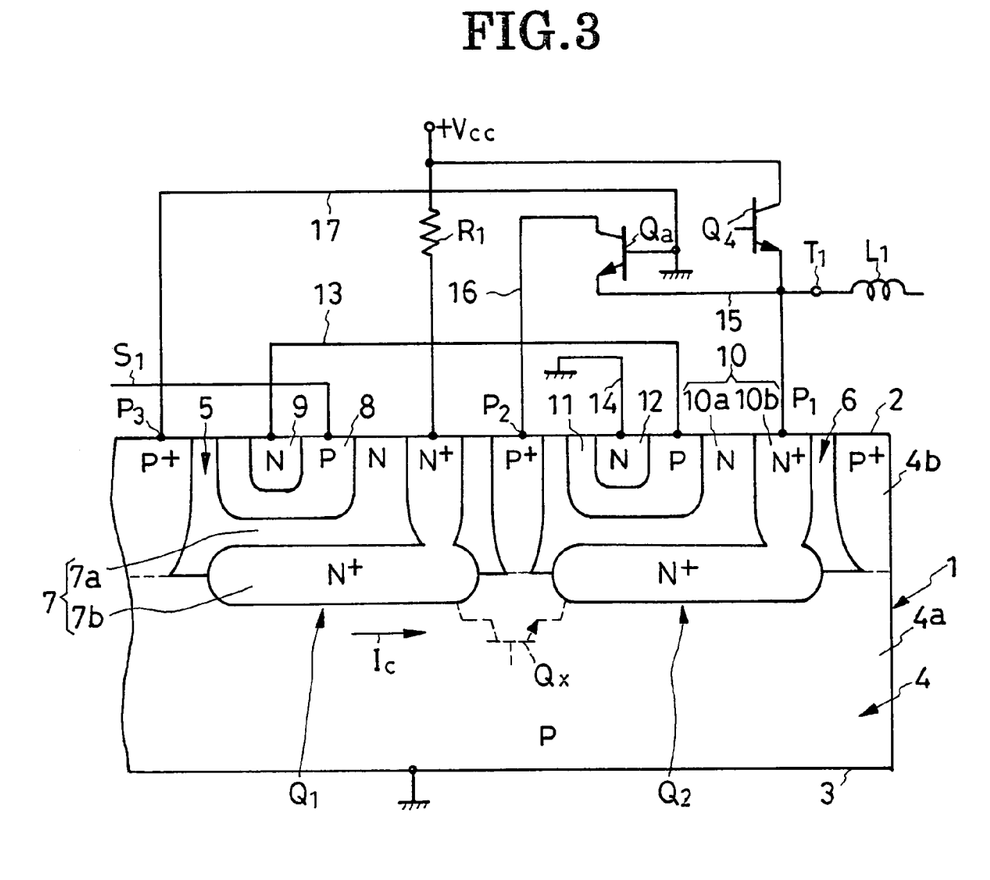
FIG. 3 is a sectional view similar to FIG. 2 but shown together a schematic electrical diagram including a performance-enhancer transistor according to the present invention as well as the associated electrical connections.
Figure 4:
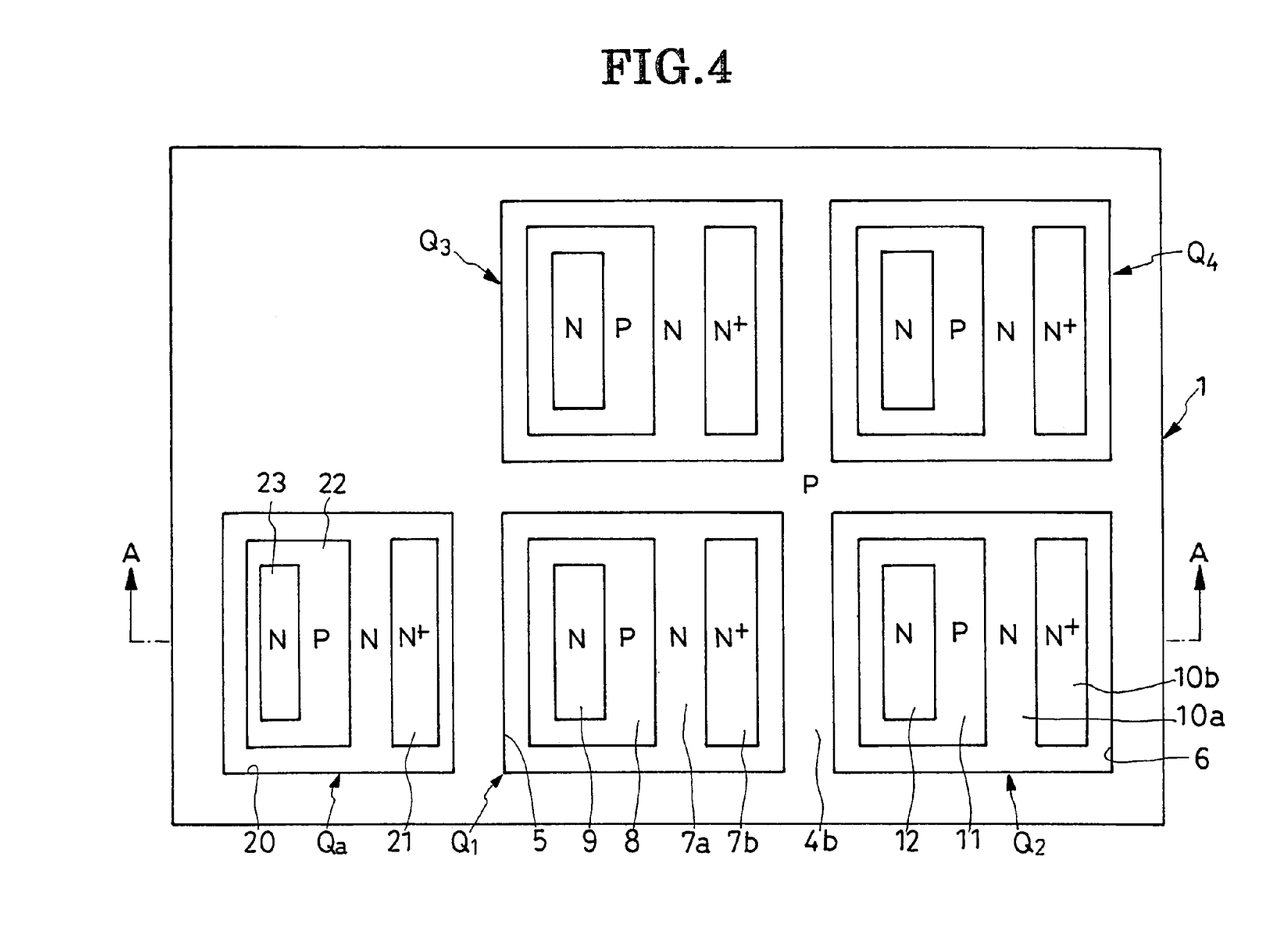
FIG. 4 is a plan view of an integrated semiconductor circuit incorporating the performance-enhancer transistor of FIG. 3 in addition to the four transistors of each motor driver circuit of FIG. 1.
Figure 5:
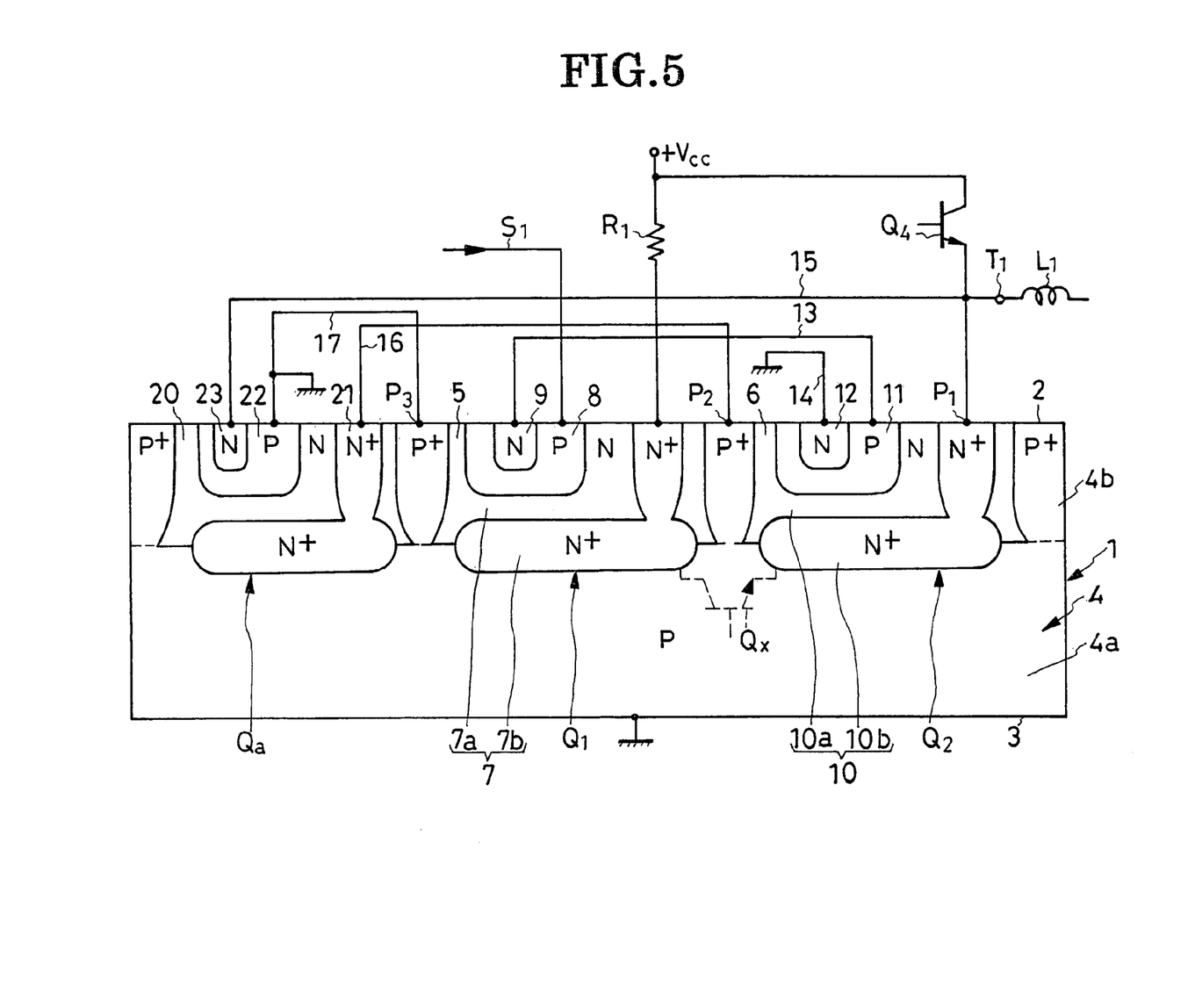
FIG. 5 is a section through the integrated circuit of FIG. 4, taken along the line A—A therein and shown together with the means needed for use as one of the motor driver circuits of FIG. 1.

Embodiment of FIGS. 3–5

FIG. 3 shows one such embodiment having an improved integrated semiconductor device for use in the motor drive system of FIG. 1, the improved semiconductor device being complete with voltage application means constituting a feature of the invention. A comparison of FIGS. 2 and 3 will reveal that the sectionally depicted parts (revealing the transistors $Q_1$ and $Q_2$ with the phantom parasitic transistor therebetween) of the integrated semiconductor devices according to the prior art and to this invention are of the same construction. Like reference characters are therefore used to denote like parts in both FIGS. 2 and 3.

Referring more specifically to FIG. 3, the generally flat semiconductor substrate 1 of the improved semiconductor device has a common semiconductor region 4 of a first conductivity type (shown asp) which is exposed at both of the pair of opposite major surfaces 2 and 3 of the substrate. Two island-like semiconductor regions 5 and 6 of a second conductivity type (shown as n) are formed in the common semiconductor region 4 so as to be exposed at the first major surface 2. These n-type island-like regions 5 and 6 are separated from the p-type semiconductor region 4 by pn junctions. These and other semiconductor regions are conventionally created in the substrate 1 by epitaxial growth and impurity diffusion.

As has been mentioned in connection with FIG. 2, the term "common semiconductor region 4", as used herein and in the claims appended hereto, should be construed to mean both the inherently p-type substrate subregion $4_a$ and the $p^+$-type separation subregion $4_b$. However, the separation subregion $4_b$ may be separately referred to as part of the common semiconductor region 4.

The first island-like region 5 has formed therein an n-type collector region 7, a p-type base region 8, and an n-type emitter region 9, for providing the first transistor $Q_1$ as the first semiconductor element. The collector region 7 comprises an n-type collector subregion $7_a$ of relatively high resistance and an $n^+$-type collector subregion $7_b$ of relatively low resistance. The high-resistance collector subregion $7_a$ is constituted of either part or whole of the first island-like region 5. The low-resistance collector subregion $7_b$ is constituted of an $n^+$-type embedded part and an $n^+$-type lead-out or plug part, the latter being exposed at the major surface 2 of the substrate 1. The base region 8 is created island-like in the low-resistance collector subregion $7_a$. The emitter region 9 is created island-like in the base region 8.

The second island-like region 6 has likewise formed therein an n-type collector region 10, a p-type base region 11, and an n-type emitter region 9, for providing the second transistor $Q_2$ as the second semiconductor element. The collector region 10 comprises an n-type collector subregion $10_a$ of relatively high resistance and an $n^+$-type collector subregion $10_b$ of relatively low resistance. The high-resistance collector subregion $10_a$ is constituted of either part or whole of the second island-like region 6. The low-resistance collector subregion $10_b$ is constituted of an $n^+$-type embedded part and an $n^+$-type lead-out or plug part, the latter being exposed at the major surface 2 of the substrate 1. The base region 11 is formed island-like in the low-resistance collector region $10_a$. The emitter region 12 is formed island-like in the base region 11.

It is understood that the integrated semiconductor device of FIG. 3 has also formed therein the transistors $Q_3$ and $Q_4$, diodes $D_1$ and $D_2$, etc., of the FIG. 1 motor driver circuit $A_1$ in addition to the first and second transistors $Q_1$ and $Q_2$. The third transistor $Q_3$ of the moor driver circuit $A_1$ is not shown in FIG. 3, however, because it is not directly associated with the parasitic transistor $Q_x$ or with the means for inhibiting its action. The fourth transistor $Q_4$ is depicted diagrammatically and outside of the semiconductor substrate 1 for illustrative convenience. Also shown diagrammatically and outside of the semiconductor substrate 1 for illustrative convenience is the noted voltage application means or performance-enhancer means constituting the feature of this invention. The voltage application means include an additional transistor $Q_a$ which, unlike the other transistors $Q_1$–$Q_4$, does not take in motor driving but which contributes toward enhancement of the performance of the motor drive system through nullification of the parasitic transistor $Q_x$. This transistor $Q_a$ will therefore be hereinafter referred to as the performance-enhancer transistor in contradistinction from the other transistors $Q_1$-$Q_4$.

FIG. 3 further indicates diagrammatically that the first transistor $Q_1$ has its p-type base region 8 connected to the control signal input $S_1$, its n-type emitter region 9 to the p-type base region 11 of the second transistor $Q_2$ by way of a conductor 13, and its low-resistance collector subregion $7_b$ to its supply terminal $+V_{cc}$ via the noted resistor $R_1$. The second transistor $Q_2$ has its n-type emitter region 12 grounded by way of a conductor 14, and its low-resistance collector subregion $10_b$ to the driver output $T_1$ and thence to the motor coil $L_1$. The p-type common semiconductor region 4 is grounded.

Excepting the performance-enhancer transistor $Q_a$, the improved semiconductor device of FIG. 3 as so far described is of the same construction as that of the prior art device of FIG. 2. As a consequence, a parasitic transistor $Q_x$ may appear between the transistors $Q_1$ and $Q_2$ as the p-type common semiconductor region 4 is interposed in part between the n-type first island-like region 5, which forms the collector of the first transistor $Q_1$, and the n-type second island-like region 6 which forms the collector of the second transistor $Q_2$. This parasitic transistor $Q_x$ is nonconductive as aforesaid when the driver output $T_1$ and second island-like region 6 have both a positive potential with respect to that of the common semiconductor region 4, because then the parasitic transistor has its base-emitter junction reverse-biased. When the driver output $T_1$ and second island-like region 6 have a negative potential, on the other hand, the parasitic transistor $Q_x$ has its base-emitter junction forward-biased and so is conductive. The performance-enhancer transistor $Q_a$ according to the invention is designed to prevent the conduction of the parasitic transistor $Q_x$, as will become apparent as the description proceeds.

Of npn construction, the performance-enhancer transistor $Q_a$ has its emitter connected by way of a conductor 15 as connection means both to the driver output $T_1$ and to a first point $P_1$ on that surface of the low-resistance collector subregion $10_b$ of the second transistor $Q_2$ which is exposed at the first major surface 2 of the substrate 1. The collector of the performance-enhancer transistor $Q_a$ is connected by way of a conductor 16 as connection means to a second point $P_2$ on that surface of the common semiconductor region 4, or of the p$^+$-type separation subregion $4_b$, which is exposed at the first major surface 2 of the substrate 1. More precisely, the second point $P_2$ is on the exposed surface of that part of the p$^+$-type separation subregion $4_b$ as a first separation subregion which lies intermediate the island-like regions 5 and 6. The base of the performance-enhancer transistor $Q_a$ is grounded on one hand and, on the other, connected by way of a conductor 17 as connection means to a third point $P_3$ on that surface of the common semiconductor region 4, or of that part of the p$^+$-type separation subregion $4_b$ as a second separation subregion, which is exposed at the first major substrate surface 2. The ground is higher in potential than the driver output $T_1$ when the driver output $T_1$ has a negative potential. The third point $P_3$ lies across the first island-like region 5 from the second point $P_2$. The performance-enhancer transistor $Q_a$ conducts when the driver output $T_1$ goes negative during operation of the motor drive system, in order to prevent the conduction of the parasitic transistor $Q_x$ as discussed in more detail hereinbelow.

When the first transistor $Q_1$ conducts in response to the motor control signal supplied through the input $S_1$, so does, too, the second transistor $Q_2$. When the first transistor $Q_1$ is nonconductive, so is the second transistor $Q_2$.

As has been explained with reference to FIGS. 1 and 2, the driver output $T_1$ may go negative with respect to the ground potential in this type of motor drive system. The negative potential at the driver output $T_1$ will make the emitter of the performance-enhancer transistor $Q_a$ less in potential than its base, resulting in conduction therethrough. The collector potential (equal to the potential at the second point $P_2$) of the performance-enhancer transistor $Q_a$ during conduction is expressed as:

$$V_{p2} = -V_{t1} - V_{CE(sat)}$$

where $V_{p2}$=potential at the second point $P_2$;
$-V_{t1}$=negative potential at the driver output $T_1$;
$V_{CE(sat)}$=collector-emitter saturation voltage of the performance-enhancer transistor $Q_a$.

As is clear from the equation above, the potential at the second point $P_2$ is negative when the collector-emitter voltage $V_{CE(sat)}$ of the performance-enhancer transistor $Q_a$ is less than the absolute value of the negative potential that can occur at the driver output $T_1$ of the motor driver circuit. The potential at this second point $P_2$ is equivalent to the base potential of the parasitic transistor $Q_x$. Thus the pn junction between the base and emitter of the parasitic transistor $Q_x$ is short-circuited by the performance-enhancer transistor $Q_a$, with the consequent prevention or substantial limitation of conduction through the parasitic transistor $Q_x$.

As indicated by the arrow in FIG. 3, the collector current $I_c$ of the performance-enhancer transistor $Q_a$ mostly flows from third point $P_3$ to second point $P_2$ through the substrate subregion $4_a$ adjacent the first transistor $Q_1$. This collector current $I_c$ can be lessened in magnitude by making the substrate subregion $4_a$ appropriately high in resistance.

FIG. 4 is a plan view of the improved integrated semiconductor device of FIG. 3, revealing not only the first and second transistors $Q_1$ and $Q_2$ but also the third and fourth transistors $Q_3$ and $Q_4$ as well as the performance-enhancer transistor $Q_a$ in their correct relative positions in the substrate 1. FIG. 5 is a section through the improved integrated semiconductor device, taken along the line A—A in FIG. 4. In this latter figure, however, the electrical connections among the required parts of the transistors $Q_1$, $Q_2$ and $Q_a$ are shown diagrammatically on the outside of the semiconductor device for illustrative convenience only; in practice, such connections are made by conductors in the insulating layer, not shown, formed on the surface of the semiconductor substrate 1. These connections are of course the same as those depicted in FIG. 3.

It will be observed from both FIGS. 4 and 5 that the performance-enhancer transistor $Q_a$ is disposed on that side of the first transistor $Q_1$ which is opposite to the side where lies the second transistor $Q_2$. The performance-enhancer transistor $Q_a$ comprises an n-type third island-like semiconductor region 20, an n$^+$-type collector region 21 formed in the island-like region 20, a p-type base region 22 formed also in the island-like region 20, and an n-type emitter region 23 formed in the base region 22.

The performance-enhancer transistor $Q_a$ might seem to add much to the size of the semiconductor device. The additional size required by this transistor $Q_a$ is, however, significantly less than that demanded by the prior art floating region between the transistors $Q_1$ and $Q_2$. Furthermore the functioning of the performance-enhancer transistor $Q_a$ is much more positive and reliable than that of the prior art floating region.

The advantages gained by this first embodiment of the invention may be summarized as follows:

1. The performance-enhancer transistor $Q_a$ positively prevents the parasitic transistor $Q_x$ from becoming active when the driver output $T_1$ goes negative in potential, so that the motor drive system is protected from erroneous operation, resulting in more accurate control of motor operation.

2. Current loss due to the performance-enhancer transistor $Q_a$ is reducible by making the substrate region $4_a$ appropriately high in resistance.

3. The integrated semiconductor device is appreciably reduced in size compared to the prior art devices that attain the same objective by spacing the transistors $Q_1$ and $Q_2$ far enough away from each other or by providing a floating region therebetween.

Figure 6:
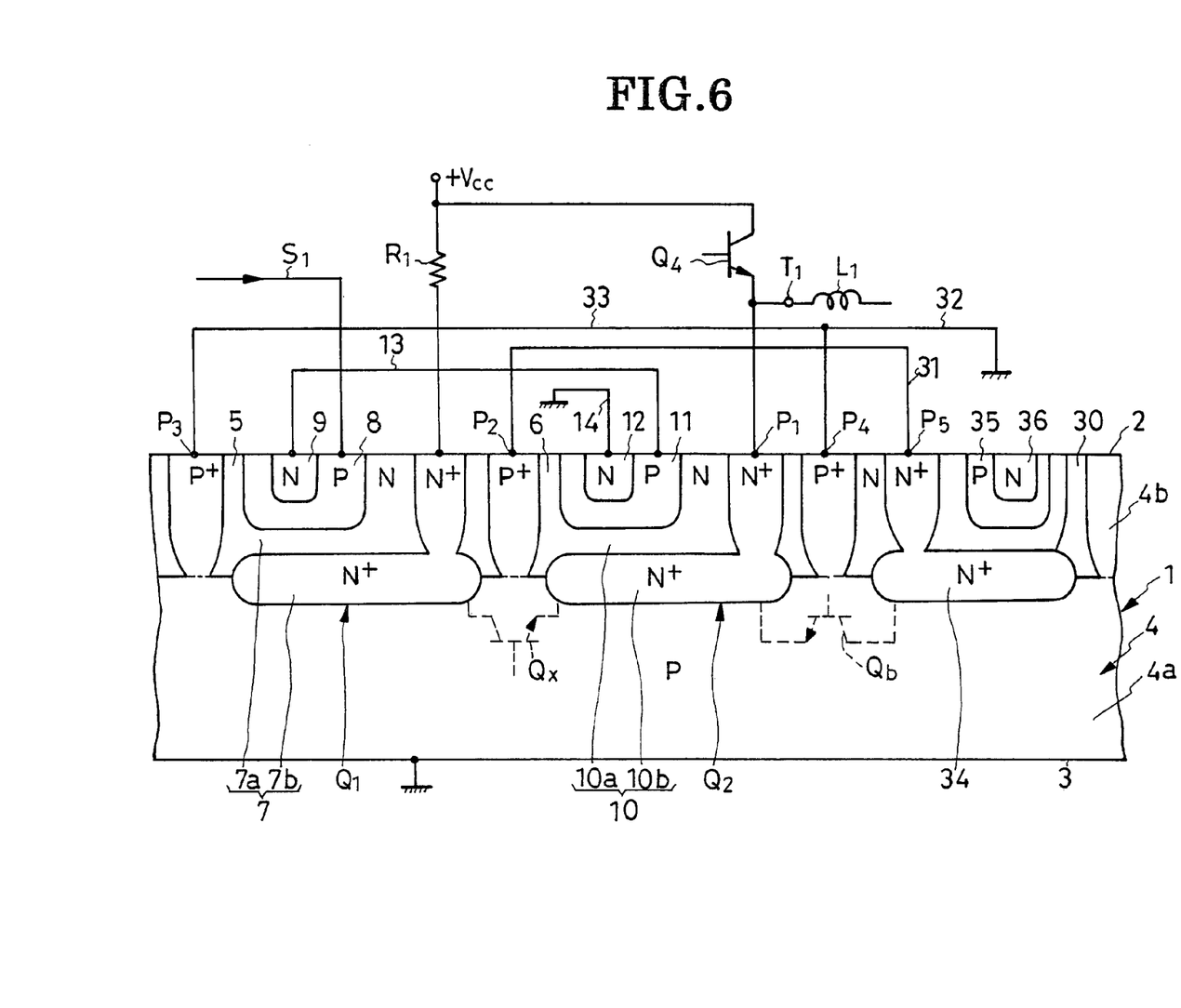
FIG. 6 is a half sectional and half diagrammatic illustration similar to FIG. 5 but showing an alternate embodiment of the invention.

Embodiment of FIG. 6

FIG. 6 shows another preferred form of integrated semiconductor device according to the invention, in a sectional view similar to FIG. 5. This alternative embodiment does not have the performance-enhancer transistor $Q_a$ of the FIGS. 3–5 embodiment but does incorporate, instead, a third n-type island-like semiconductor region 30 in the semiconductor substrate 1. This third island-like region 30 is designed for intentional creation of an additional parasitic transistor $Q_b$ in coaction with the preexisting second transistor $Q_2$ in order to preclude the harmful effect of the undesired parasitic transistor $Q_x$. The additional parasitic transistor $Q_b$ will therefore be hereinafter referred to as the performance-enhancer parasitic transistor.

Referring more specifically to FIG. 6, the third island-like region 30 is arranged on that side of the second transistor $Q_2$ which is opposite to the side where there lies the first transistor $Q_1$. The undesired parasitic transistor $Q_x$ exists between the two neighboring transistors $Q_1$ and $Q_2$. Formed in the third island-like region 30 is an npn transistor comprising an $n^+$-type collector region 34, a p-type base region 35, and an n-type emitter region 36. The transistor thus formed in the third island-like region 30 lends itself to any appropriate use in each specific application of this integrated circuit. It is not, however, the complete transistor in the third island-like region 30, but only its collector (or $n^+$-type semiconductor region) 34, that coacts with the $n^+$-type collector subregion $10_b$ of the second transistor $Q_2$ and the common semiconductor region 4 to provide the desired npn-type performance-enhancer parasitic transistor $Q_b$.

In order to counteract the undesired parasitic transistor $Q_x$ by the performance-enhancer parasitic transistor $Q_b$, a point $P_5$ on the exposed surface of the $n^+$-type semiconductor region 34 is connected by way of a conductor 31 to the noted point $P_2$ on the exposed surface of that part of the separation subregion $4_b$ as a first separation subregion of the common semiconductor region 4 which lies between the transistors $Q_1$ and $Q_2$. Further a point $P_4$ on the exposed surface of that part of the separation subregion $4_b$ which lies between the second and third island-like regions 6 and 30 is grounded by way of a conductor 32. Still further a point $P_3$ on the exposed surface of that part of the separation subregion $4_b$ as a second separation subregion which lies outside of the transistor $Q_1$ is also grounded by way of a conductor 33. The point $P_1$ on that surface of the low-resistance collector subregion $10_b$ of the second transistor $Q_2$ is connected as in the previous embodiment to the emitter of the fourth transistor $Q_4$ and to the driver output $T_1$.

Thus, when the driver output $T_1$ has a negative potential $-V_{t1}$, so does the point $P_1$. The result is the forward biasing of the pn junction between the points $P_1$ and $P_4$, that is, between the $n^+$-type collector subregion $10_b$ of the second transistor $Q_2$ and the $p^+$-type separation subregion $4_b$. Thereupon the performance-enhancer parasitic transistor $Q_b$ will conduct. The potential at the point $P_5$ on the $n^+$-type semiconductor region 34 can therefore be defined as:

$$V_{p5} = -V_{t1} - V_{CE(sat)}$$

where
$V_{p5}$=potential at the point $P_5$;
$V_{CE(sat)}$=collector-emitter saturation voltage of the performance-enhancer parasitic transistor $Q_b$.

The point $P_5$ is connected by way of the conductor 31 to the point $P_2$ on that part of the separation subregion $4_b$ which lies between the transistors $Q_1$ and $Q_2$. The potential $V_{p2}$ at the point $P_2$ is therefore equal to the potential $V_{p5}$ at the point $P_5$. Hence:

$$V_{p2} = V_{p5} = -V_{t1} - V_{CE(sat)}.$$

The point $P_2$ will have a negative potential when the driver output $T_1$ has a negative potential whose absolute value is higher than the collector-emitter saturation voltage $V_{CE(sat)}$ of the performance-enhancer parasitic transistor $Q_b$. Thus, as in the FIGS. 3–5 embodiment, the conduction of the undesired parasitic transistor $Q_x$ will be reduced to a minimum.

Notwithstanding the foregoing detailed disclosure it is not desired that the present invention be limited by the exact details of the attached drawings or the description thereof. For example, in the FIGS. 3–5 embodiment, the performance-enhancer transistor $Q_a$ could be provided external to the semiconductor substrate 1 for further reduction in the size of the substrate itself. The performance-enhancer npn transistor $Q_a$ itself might be replaced by other semiconductor elements such as the field-effect transistor or static induction transistor. Also, the other transistors $Q_1$–$Q_4$ might be replaced by other semiconductor elements such as the field-effect transistor or static induction transistor, respectively. Additionally, in the alternate embodiment of FIG. 6, the fabrication of the transistor in the third island-like semiconductor region 30 is not an essential feature of this invention, all that is required being that there be the $n^+$-type region 34 for creation of the performance-enhancer parasitic transistor $Q_b$ in cooperation with the $n^+$-type collector subregion $10_b$ of the second transistor $Q_2$. The $n^+$-type region 34 could occupy the whole of the island-like region 30.

All these and other modifications or alterations of the illustrated embodiments which will readily occur to the semiconductor specialists are intended in the foregoing disclosure. The invention should therefore be construed broadly and in a manner consistent with the fair meaning or proper scope of the claims which follow.

What is claimed is:

1. An integrated semiconductor device including at least two semiconductor elements, with means for preventing the action of a parasitic transistor between the semiconductor elements, comprising:
    (a) a semiconductor substrate;
    (b) a common semiconductor region of a first conductivity type formed in the semiconductor substrate;
    (c) a first semiconductor element formed in the common semiconductor region and having a first island-like semiconductor region of a second conductivity type which is opposite to the first conductivity type, the first island-like semiconductor region being contiguous to the common semiconductor region;
    (d) a second semiconductor element formed in the common semiconductor region and having a second island-like semiconductor region of the second conductivity type contiguous to the common semiconductor region;
    (e) the first and the second semiconductor element being spaced from each other via the common semiconductor region, with the consequent creation of a parasitic transistor by the common semiconductor region of the first conductivity type and the first and the second island-like semiconductor region of the second conductivity type;
    (f) performance-enhancer means connected to the second island-like semiconductor region and the common semiconductor region for preventing the conduction of the parasitic transistor when the second island-like semiconductor region is less in potential than the common semiconductor region.

2. The integrated semiconductor device of claim 1 wherein the common semiconductor region includes a separation subregion intermediate the first and the second island-like semiconductor region, and wherein the performance-enhancer means comprises a performance-enhancer semiconductor element having a first terminal connected to the second island-like semiconductor region and having a second terminal connected to the separation subregion of the common semiconductor region, the performance-enhancer semiconductor element becoming conductive between the first and the second terminal when the second island-like semiconductor region has a negative potential.

3. The integrated semiconductor device of claim 2 wherein the performance-enhancer semiconductor element is a transistor having an emitter connected to the second island-like semiconductor region, a collector connected to the separation subregion of the common semiconductor region, and a base connected to a circuit point that is higher in potential than the second island-like semiconductor region when the latter has a negative potential.

4. The integrated semiconductor device of claim 2 wherein the performance-enhancer semiconductor element is integrally incorporated in the same semiconductor substrate as the first and the second semiconductor element.

5. The integrated semiconductor device of claim 2 wherein the performance-enhancer semiconductor element is external to the semiconductor device.

6. The integrated semiconductor device of claim 1 wherein the first semiconductor element is a first transistor having a collector region of the second conductivity type, a base region formed in the collector region, and an emitter region formed in the base region, and wherein the second semiconductor element is a second transistor having a collector region of the second conductivity type, a base region formed in the collector region, and an emitter region formed in the base region, and wherein the common semiconductor region includes a first separation subregion intermediate the collector region of the first transistor and the collector region of the second transistor, and wherein the performance-enhancer means comprises:

(a) a performance-enhancer transistor formed in the semiconductor substrate, the third transistor having a collector region of the second conductivity type and disposed adjacent the collector region of the first transistor via a second separation subregion of the common semiconductor region, a base region formed in the collector region, and an emitter region formed in the base region;

(b) means connecting the collector region of the performance-enhancer transistor to first separation subregion;

(c) means connecting the second separation subregion to a circuit point that is higher in potential than the collector region of the second transistor when the latter has a negative potential;

(d) means connecting the base region of the performance-enhancer transistor to a circuit point that is higher in potential than the collector region of the second transistor when the latter has a negative potential; and (e) means connecting the emitter region of the performance-enhancer transistor to the collector region of the second transistor.

7. The integrated semiconductor device of claim 1 wherein the common semiconductor region includes a first separation subregion intermediate the first and the second island-like semiconductor region, and wherein the performance-enhancer means comprises:

(a) a third island-like semiconductor region of the second conductivity type formed in the semiconductor substrate and disposed adjacent the second island-like semiconductor region via a second separation subregion of the common semiconductor region;

(b) means connecting the third island-like semiconductor region to first separation subregion; and (c) means connecting the second separation subregion to a circuit point that is higher in potential than the second island-like semiconductor region when the latter has a negative potential.

8. The integrated semiconductor device of claim 7 wherein the common semiconductor region has a third separation subregion contiguous to the first island-like semiconductor region, and wherein the second separation subregion is connected to at least either of the third separation subregion and ground.

9. The integrated semiconductor device of claim 7 wherein the third island-like semiconductor region has an additional semiconductor element formed therein.

* * * * *